United States Patent [19]
Lev et al.

[11] Patent Number: 5,619,149
[45] Date of Patent: *Apr. 8, 1997

[54] SINGLE ENDED DYNAMIC SENSE AMPLIFIER

[75] Inventors: Lavi A. Lev, San Jose; Michael Allen, San Francisco, both of Calif.

[73] Assignee: Sun Microsystems, Inc., Mountain View, Calif.

[*] Notice: The term of this patent shall not extend beyond the expiration date of Pat. No. 5,495,191.

[21] Appl. No.: 389,152

[22] Filed: Feb. 15, 1995

Related U.S. Application Data

[63] Continuation-in-part of Ser. No. 218,230, Mar. 25, 1994, Pat. No. 5,495,191.

[51] Int. Cl.⁶ .................. H03K 19/094; G11C 7/06
[52] U.S. Cl. .................. 327/51; 327/55; 327/309
[58] Field of Search .................. 327/50, 53, 54, 327/55, 57, 309, 384, 386–388, 419, 427; 365/203, 206, 207

[56] References Cited

U.S. PATENT DOCUMENTS

| | | | |
|---|---|---|---|
| 4,535,259 | 8/1985 | Smarandoiu et al. | 327/51 |
| 4,598,389 | 7/1986 | Duvvury et al. | 327/51 |
| 4,804,865 | 2/1989 | Clark, II | 327/309 |
| 4,924,442 | 5/1990 | Chen et al. | 327/309 |
| 4,972,102 | 11/1990 | Reis et al. | 327/51 |
| 4,982,363 | 1/1991 | Sood | 365/203 |
| 5,056,063 | 10/1991 | Santin et al. | 327/51 |
| 5,243,571 | 9/1993 | Brossard | 365/203 |
| 5,268,600 | 12/1993 | Yeu | 327/309 |
| 5,272,674 | 12/1993 | Pathak et al. | 327/310 |
| 5,357,156 | 10/1994 | Herrington | 327/309 |

*Primary Examiner*—Timothy P. Callahan
*Assistant Examiner*—T. Lam
*Attorney, Agent, or Firm*—Blakely Sokoloff Taylor & Zafman LLP

[57] ABSTRACT

A single-ended sense amplifier circuit for sensing the state of a bitline in a memory array. The sense amplifier includes an output circuit having an input and an output, the output for indicating a state of the bitline in response to a bitline voltage level. A precharge circuit is coupled to the input for charging the input to a first voltage level when the input is decoupled from the bitline. A discharge circuit is coupled between the bitline and the input. In one embodiment, the discharge circuit includes a field effect transistor coupled as a cascode device for coupling and decoupling the input to the bitline. The discharge circuit couples the input to the bitline when the discharge voltage level exceeds a threshold voltage level of the discharge circuit. The sense amplifier circuit also includes a noise margin circuit coupled to the bitline for charging the bitline to a voltage level that is less than the first voltage level such that the discharge voltage level is less than the threshold voltage level by a predetermined noise margin voltage.

17 Claims, 4 Drawing Sheets

SINGLE ENDED DYNAMIC SENSE AMPLIFIER

This is a continuation-in-part of application Ser. No. 08/218,230, filed Mar. 25, 1994, now U.S. Pat. No. 5,495,191, for "Single Ended Dynamic Sense Amplifier".

FIELD OF THE INVENTION

The method and apparatus of the present invention relates generally to the sensing of data in a memory, and more particularly to the sensing of data stored in memory arrays.

BACKGROUND OF THE INVENTION

Read only memories (ROMs) and random access memories (RAMs), whether implemented as stand alone memory circuits or used in a processor register file, typically include a number of memory locations arranged in a matrix of rows and columns. The contents of a memory location are read by applying an input voltage to a selected wordline, or row, and sensing whether the voltage of the bitline, or column, changes. The bitline acts as a capacitor, and is typically precharged to a predetermined voltage prior to reading the memory location. If the memory location includes a field effect transistor (FET) having its source coupled to ground, its drain coupled to the bitline, and its gate coupled to the selected wordline, the input voltage causes the FET to switch on, coupling the bitline to ground. Coupling the bitline to ground causes the bitline to discharge, and the voltage of the bitline drops towards ground, indicating a first logic state. If the memory location does not contain a FET, applying the input voltage does not discharge the bitline, and the bitline remains at the precharged voltage, indicating a second logic state.

Typical prior art ROMs and RAMs use a sense amplifier to sense the state of the selected bitline. One type of sense amplifier is a single ended sense amplifier that has the bitline as its input. The presence of a transistor at the selected memory location is detected by the negative going voltage of the bitline, which is caused by the bitline discharging towards ground when the transistor is switched on.

One concern in sense amplifier design is the speed of the sense amplifier. The speed of the sense amplifier is determined by the sensitivity of the sense amplifier to the discharging of the bitline. A very sensitive sense amplifier has its trip-point voltage, $V_{trip}$, very close to the precharge voltage, which is typically VCC, such that a small drop in the voltage level of the bitline causes the sense amplifier to detect a programmed memory location. For a very low sensitivity sense amplifier, $V_{trip}$ may be ground. Of course, it typically takes more time to discharge the bitline from VCC to ground than it takes to discharge the bitline from VCC to VCC minus a millivolt. It also takes longer to precharge the bitline to VCC when the bitline is discharged to a lower voltage. Thus, the more sensitive the sense amp, the less time it will take to discharge and precharge the bitline.

Another consideration in sense amp design is power consumption. The act of charging and discharging the bitline results in power consumption. The greater the swing between precharged and discharged voltage levels, the greater the power consumption. This consideration is essential in portable computing devices. Therefore, the level to which the bitline must be precharged is important in portable computer designs.

A typical prior art solution is to provide a cascode device coupled between the bitline and the input of the output stage of the single-ended sense amplifier. The cascode device may be an n-channel field effect transistor having its drain coupled to the input of the output stage, its source coupled to the bitline, and its gate coupled to a constant voltage source, typically VCC. A pull-up device is coupled to the drain such that the bitline is precharged to a voltage equal to the voltage of the constant voltage source minus the threshold voltage of the cascode transistor, at which time the cascode transistor switches off, decoupling the input of the output stage from the bitline. The input of the output stage will be precharged all the way to VCC. To reduce the precharge voltage swing, the constant voltage source may be some intermediate voltage between ground and VCC. During a read cycle, if the selected ROM location is programmed, the drop in the bitline voltage will cause the cascode transistor to switch on, coupling the bitline to the input of the output stage. The voltage at the input of the output stage drops rapidly to the voltage of the bitline through charge sharing. An example of such a circuit may be found in *Design and Analysis of VLSI Circuits* by Lance A. Glasser and Daniel W. Dobberpuhl, at pages 273–274.

A problem of this prior art sense amplifier is that noise on the bitline can cause the cascode transistor to inadvertently switch on, resulting in the reading of invalid data. This is due to the fact that the gate-source voltage of the device is just at the edge of the threshold voltage. Therefore, a noise margin must be provided to account for noise that can be injected on the bitline. Such noise can be, for example, a result of capacitive affects of adjacent bitlines in the matrix. Providing a sufficient noise margin increases the reliability of data.

As will be discussed, the method and apparatus of the present invention is directed to a dynamic single ended sense amplifier circuit having increased sense speed, decreased power consumption, and adjustable noise margins.

SUMMARY OF THE INVENTION

A single-ended sense amplifier circuit for sensing the state of a bitline in a memory array is described. The sense amplifier includes an output circuit having an input and an output, the output for indicating a state of the bitline in response to a bitline voltage level. A precharge circuit is coupled to the input for charging the input to a first voltage level when the input is decoupled from the bitline. A discharge circuit is coupled between the bitline and the input. In one embodiment, the discharge circuit includes a field effect transistor coupled as a cascode device for coupling and decoupling the input to the bitline. The discharge circuit couples the input to the bitline when the discharge voltage level exceeds a threshold voltage level of the discharge circuit. The sense amplifier circuit also includes a noise margin circuit coupled to the bitline for charging the bitline to a voltage level that is less than the first voltage level such that the discharge voltage level is less than the threshold voltage level by a predetermined noise margin voltage.

For the single-ended sense amplifier circuits of the various embodiments, lower power consumption and increased speed is provided by the fact that the bitline need not be charged all the way to VCC. Further, improved speed is achieved through the use of charge sharing between the input and the bitline, which allows the output circuit to include lower sensitivity devices. Finally, the noise margins of the sense amplifier circuit may be varied by varying the components of the noise margin circuit.

BRIEF DESCRIPTION OF THE DRAWINGS

The objects, features, and advantages of the method and apparatus of the present invention will be apparent from the following detailed description of the invention in which.

DETAILED DESCRIPTION OF THE INVENTION

Apparatus and methods for sensing data in a memory are disclosed. In particular, the present invention is a single ended sense amplifier circuit. The sense amplifier circuit includes a transistor coupled as a cascode device having its gate coupled to the bitline via an inverter. To provide a predetermined noise margin, the sense amplifier circuit also includes a noise margin circuit that continues to charge the bitline after the cascode device has decoupled the bitline from a sense node. The bitline is only charged enough to provide the desired noise margin. Although the present invention is described with reference to specific circuits, block diagrams, signals, algorithms, etc., it will be appreciated by one of ordinary skill in the art that such details are disclosed simply to provide a more thorough understanding of the present invention. It will therefore be apparent to one skilled in the art that the present invention may be practiced without the specific details. In other instances well known circuits are shown in block diagram form in order not to obscure the present invention unnecessarily.

Figure 1:
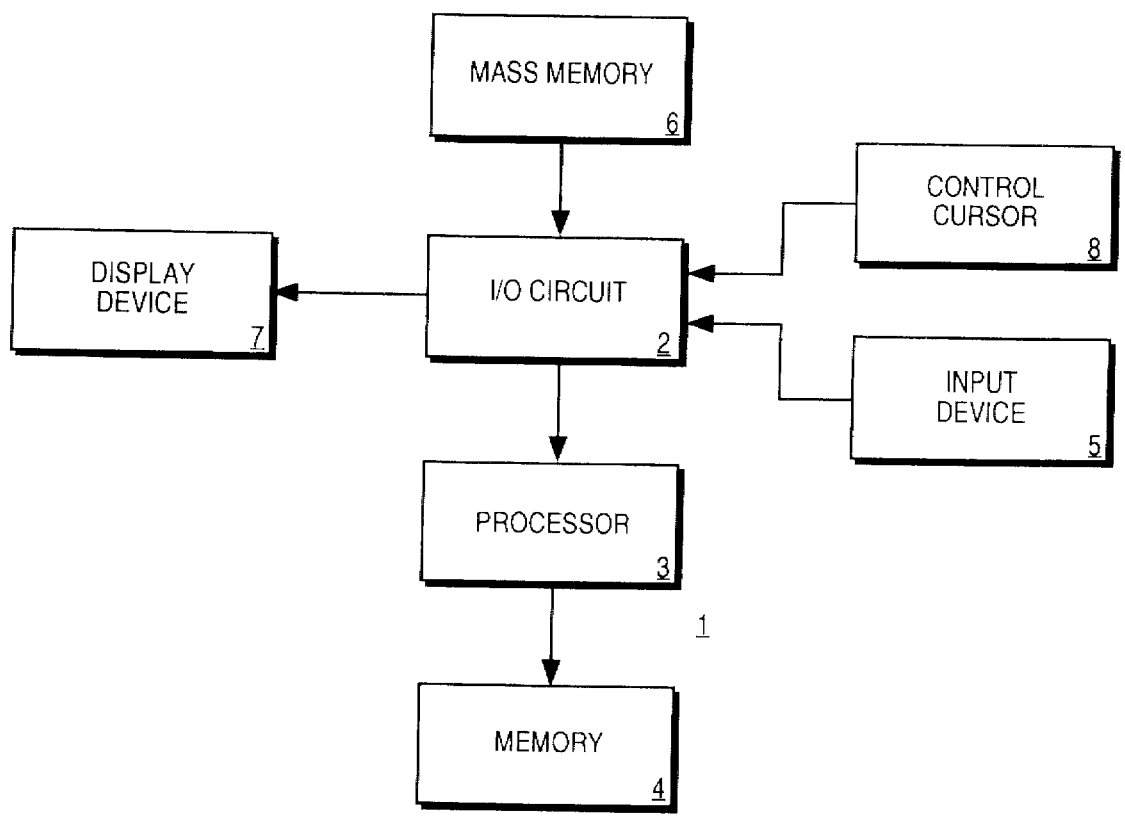
FIG. 1 shows a typical computer based system in which the method and apparatus of the present invention may be implemented.

FIG. 1 shows a typical computer based system in which the method and apparatus of the present invention may be implemented. Shown there is a computer 1 which comprises three major components. The first of these is the input/output (I/O) circuit 2 which is used to communicate information in appropriately structured form to and from the other parts of the computer 1. Also shown as a part of computer 1 is a processor that preferably includes a register file that implements sense amplifier circuitry according to the present invention, and memory 4. Particular examples of suitable data processors to fill the role of computer 1 include machines manufactured by Sun Microsystems, Inc., Mountain View, Calif. Other computers having like capabilities may of course be adapted in a straight forward manner to perform the functions described below.

Also shown in FIG. 1 is an input device 5, which is typically a keyboard. It should be understood, however, that the input device may actually be a card reader, magnetic or paper tape reader, or other well known device (including, of course, another computer). A mass memory device 6 is coupled to the I/O circuit 2 and provides additional storage capability for the computer 1. The mass memory 6 may include other programs and the like and may take the form of a magnetic or paper tape reader or other well known device. It will be appreciated that the data retained at the mass memory 6, may, in appropriate cases, be incorporated in standard fashion into computer 1 as part of memory 4. Memory 4 may include ROMs that implement the sense amplifier circuitry of the illustrative embodiments of the present invention. In addition, a display device 7 is illustrated which is used to display messages or other communications to the user. Such a display device may take the form of any of several well known varieties of CRT displays. Preferably, the display device 7 displays graphic images. A cursor control 8 is used to select command modes and provide a more convenient mechanism to input information into the system.

Figure 2:
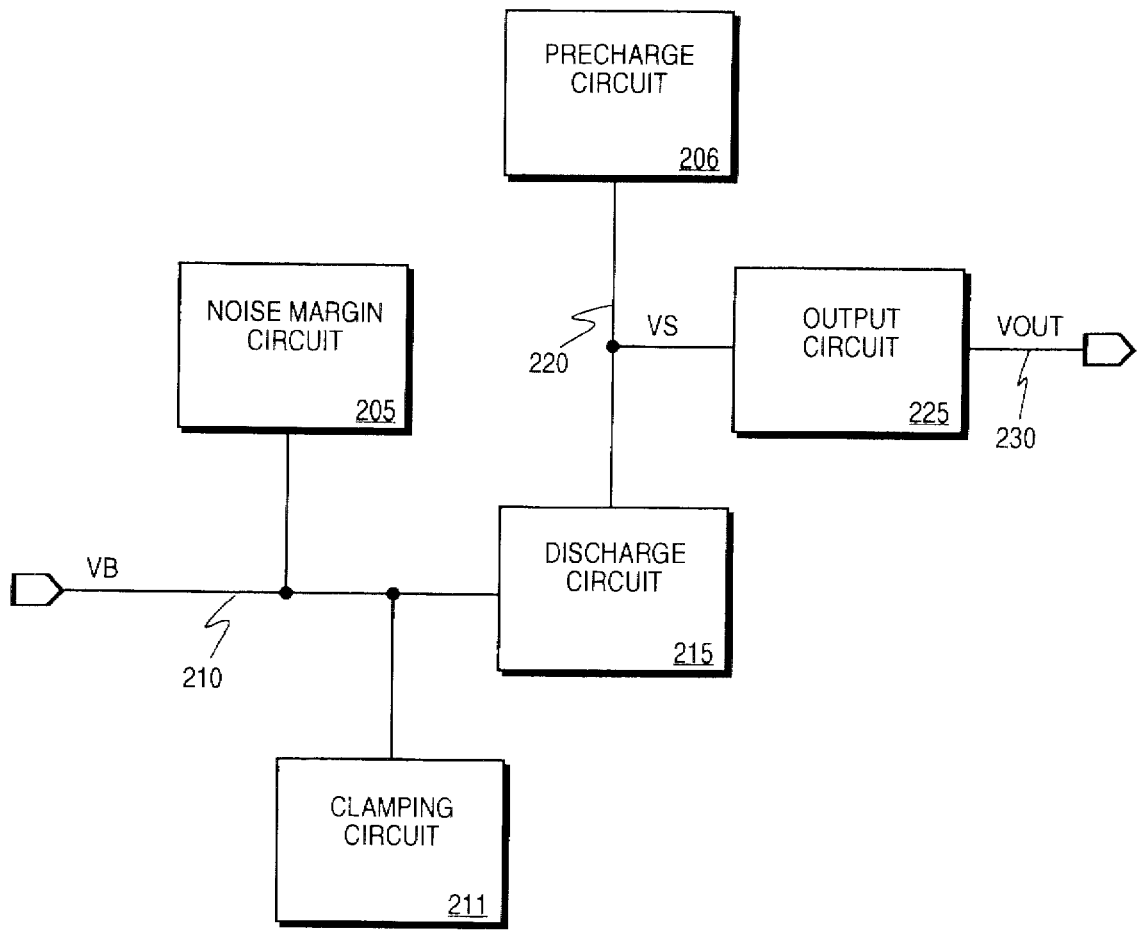
FIG. 2 is a block diagram illustrating the single ended sense amplifier circuit of a first embodiment of the present invention.

FIG. 2 is a block diagram illustrating the single ended sense amplifier circuit of a first embodiment of the present invention. Sense amplifier circuit 200 includes a noise margin circuit 205 coupled to the bitline 210. Also coupled to bitline 210 are discharge circuit 215, and clamping circuit 211. A sense node 220 couples the discharge circuit 215 to a precharge circuit 206 and to the input of an output circuit 225. The precharge circuit 206 precharges the sense node 220 between read cycles to a sense voltage $V_S$. $V_S$ is precharged to approximately VCC.

The output circuit 225 senses the voltage level at sense node 220 and outputs a resulting output voltage, $V_{out}$, at output node 230. The output voltage $V_{out}$ preferably corresponds to either a logic high or a logic low level, depending on the state of the bitline 210. For this embodiment, an erased memory location is indicated by a logic high and a programmed memory location is indicated by a logic low. If the output circuit 225 senses that $V_S$ is above a trip point voltage of the output circuit, $V_{trip}$, during a read cycle, $V_{out}$ is set to a logic high voltage level. If $V_S$ fails below $V_{trip}$, the output circuit 225 sets $V_{out}$ to a logic low voltage level.

The discharge circuit 215 is for coupling and decoupling the sense node 220 and the bitline 210 in response to the bitline voltage $V_B$. The capacitance of the sense node 220, $C_{sense}$, is preferably much less than the capacitance of the bitline 210, $C_{bitline}$, such that, when the discharge circuit 215 couples the sense node 220 to the bitline 210, $V_S$ drops rapidly to the voltage level of bitline 210, which is $V_B$. This rapid drop is due to charge sharing, as is well known in the art. The rate at which $V_S$ discharges towards $V_C$ is increased if the capacitance of bitline 210 is increased with respect to the capacitance of sense node 220.

The noise margin circuit 205 is for providing a predetermined noise margin for the sense amplifier circuit 200. Between read cycles, the noise margin circuit 205 precharges the bitline 210. The bitline 210 is preferably charged such that $V_B$ is just large enough to provide a predetermined noise margin voltage $V_{noise}$.

For this embodiment, only the sense node 220 is charged to VCC. This charging may be done quickly due to the relatively small capacitance $C_{sense}$. The bitline 210, however, is preferably charged only enough to provide a predetermined noise margin, $V_{noise}$, such that any drop in the bitline voltage $V_B$ that does not exceed $V_{noise}$ will not result in the discharge circuit 215 coupling the sense node 220 to the bitline 210. This noise margin thus results in higher reliability data. The use of the noise margin circuit 205 reduces the overall power consumption of the ROM or RAM because the swings between the precharge and discharge voltage levels for $V_B$ are reduced. The clamping circuit 211 may be optionally provided for certain types of memory arrays to prevent the bitline voltage $V_B$ from being charged to too great a value.

Figure 3:
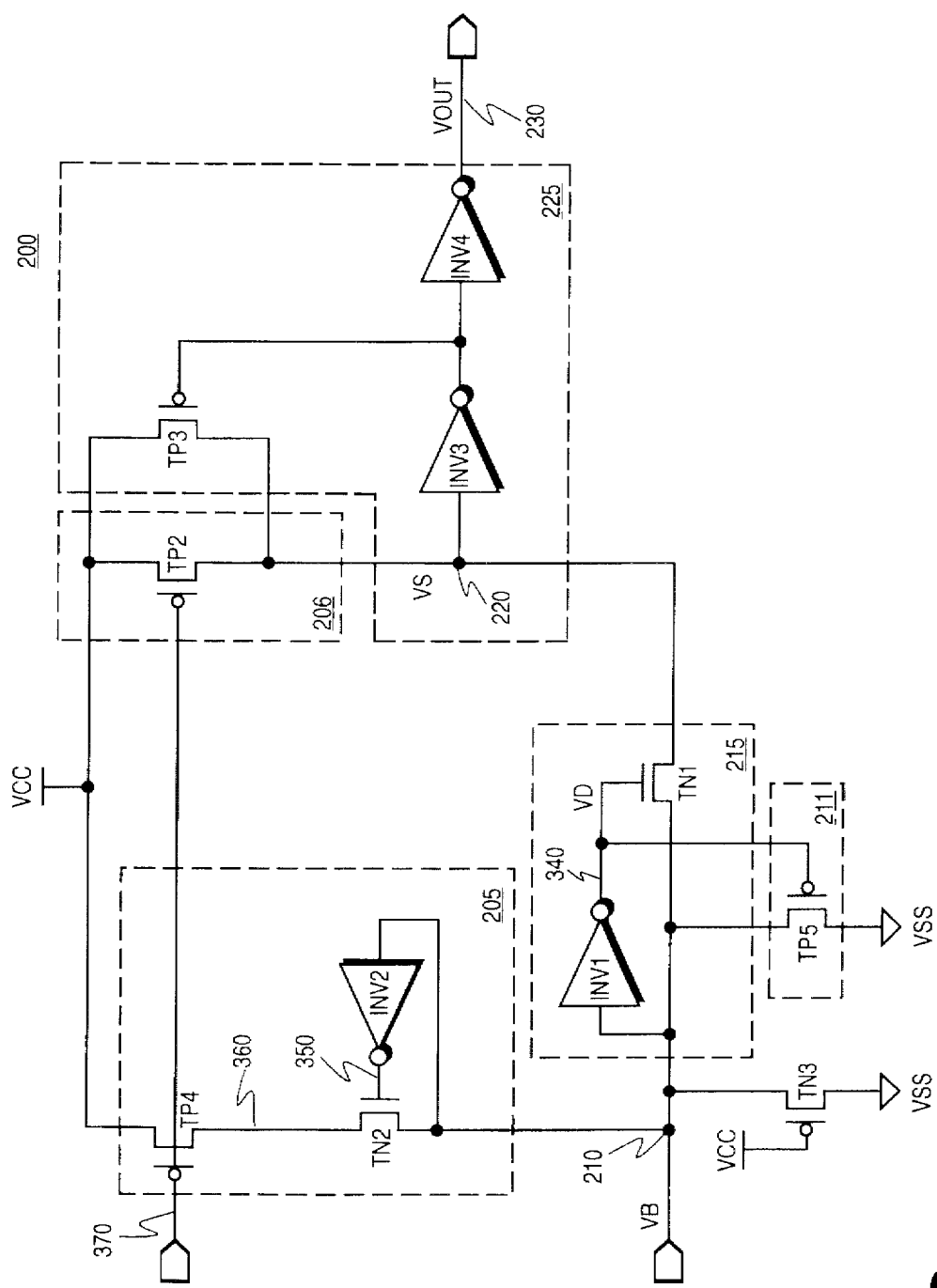
FIG. 3 illustrates the single ended sense amplifier circuit of the first embodiment in more detail

FIG. 3 illustrates the single ended sense amplifier circuit of the first embodiment in more detail. In the sense amplifier circuit 200, the output circuit 225 includes inverters INV3, INV4 and p-channel field effect transistor (FET) TP3; the precharge circuit 206 includes p-channel FET TP2; the clamping circuit 211 includes p-channel FET TP5; the discharge circuit 215 includes inverter INV1 and n-channel FET TN1; and the noise margin circuit 205 includes p-channel FET TP4, n-channel FET TN2 and inverter INV2. The sense amplifier circuit 200 is also shown as including a pull-down n-channel FET TN3 that is optionally provided to reduce the power consumption of sense amplifier circuit 200 during reduced power modes of operation.

For this embodiment, the precharge circuit 206 includes a p-channel FET TP2. The FET TP2 preferably precharges the sense node 220 in response to a periodic precharge signal coupled to its gate via node 370. When the precharge signal is low, the FET TP2 is switched on, and the sense node 220 is charged to VCC. The FET TP2 is switched off when the precharge signal is high.

For the output circuit 225, the inverter INV3 senses the state of the sense node 220. If $V_S$ drops below a trip point voltage $V_{trip}$ for the inverter INV3, the INV3 outputs a logic high. If the $V_S$ remains above $V_{trip}$, the inverter INV3 outputs a logic low. This logic low level switches the FET TP3 on such that the sense node voltage $V_S$ remains at or near VCC. The inverter INV4 is coupled to receive the output of INV3, which INV4 inverts to provide the output voltage $V_{out}$. The thresholds of INV3 and INV4 are preferably skewed to favor the falling output transition at sense node 220.

For the discharge circuit 215, FET TN1 couples and decouples bitline 210 from sense node 220 in response to the voltage level $V_B$ of bitline 210. Inverter INV1 has its input coupled to bitline 210 and its output coupled to the gate of FET TN1, at node 340. FET TN1 acts as a cascode transistor. As the voltage level $V_B$ of bitline 210 increases, the voltage $V_D$ at node 340 decreases. Conversely, the voltage $V_D$ increases as $V_B$ decreases. The source of FET TN1 is coupled to bitline 210 such that increasing $V_B$ results the rapid decrease of the gate-source voltage of TN1 towards the threshold voltage $V_{TN1}$ of TN1. Similarly, any decrease in $V_B$ results in the rapid increase of the gate-source voltage of TN1. When the FET TN1 initially switches off, the gate-source voltage $(V_D-V_B)$ is approximately equal to the threshold voltage $V_{TN1}$ of the FET TN1.

The noise margin circuit 205 includes FETs TN2 and TP4 and inverter INV2. The FET TP4, like FET TP2, has its gate coupled to the precharge signal at node 370. Thus, when the precharge signal is low, the FET TP4 will be switched on to pull up the bitline 210 towards VCC. The extent to which the bitline voltage $V_B$ is increased after the discharge circuit decouples the bitline 210 from the sense node 220 is determined by the operating characteristics of FET TN2 and inverter INV2. The FET TN2 has its source coupled to bitline 210 and its gate coupled to the output of inverter INV2, which has bitline 210 as its input. The FET TN2 preferably has operating characteristics identical to FET TN1. Inverter INV2, however, is preferably different from inverter INV1 such that the voltage at node 350 is higher than the voltage $V_D$ at node 340, given the identical bitline voltage $V_B$ as the input to both inverters. In this manner, the FET TN2 remains on for a time after FET TN1 switches off, and the bitline is charged higher to provide a noise margin.

Thus, the gate-source voltage of FET TN1, which is equal to $(V_D-V_B)$, is equal to $(V_{TN1}-V_{noise})$ when the noise margin circuit 205 switches off.

The operating characteristics of the inverter INV2 can be varied from those of inverter INV1 using techniques well-known in the art. For example, the channel width of the n-channel transistor of INV2 can be made smaller than the channel width of the corresponding n-channel transistor of INV1. The width of the noise margin can thus be adjusted by varying the relative sizes of the n-channel transistors of the inverters. An alternative method for varying the noise margin is to select FET TN2 to have a lower threshold voltage than FET TN1.

Clamping circuit 211, which is shown as comprising FET TP5 having its gate coupled to node 340, its source coupled to bitline 210, and its drain coupled to system ground VSS, may be provided to ensure that excess noise margin is not inadvertently provided. Under the appropriate circumstances, sense amplifier 200 may be caused to successively sense memory locations having a logic high value in response to a series of memory read operations. For an array of static RAM (SRAM) cells, an SRAM cell having a logic high value acts as a weak pull-up device that can raise the bitline voltage $V_B$. A single read operation of a memory location having a logic high value may not be sufficient to appreciably affect the bitline voltage $V_B$, but multiple successive read operations of such memory locations can significantly increase the bitline voltage $V_B$, which decreases the gate voltage VD of FET TN1 and provides excess noise margin. Providing more noise margin results in requiring a greater amount of time to discharge the bitline 210 to a voltage low enough to switch FET TN1 on, thus slowing the speed at which a memory location may be read.

To prevent the bitline 210 from being charged to too high a value, FET TP5 selectively provides a conducting path from the bitline 210 to system ground VSS when the voltage $V_D$ at node 340 goes below the bitline voltage $V_B$ by more than the threshold voltage $V_{TP5}$ of FET TP5. The threshold voltage $V_{TP5}$ is selected such that FET TP5 switches on to discharge bitline 210 towards system ground VSS when bitline voltage $V_B$ increases sufficiently to cause the gate-source voltage of FET TN1 to drop below the known quantity $(V_{TN1}-V_{noise})$. In other words, FET TP5 switches on when the noise margin voltage exceeds $V_{noise}$, and switches off when the noise margin voltage is less than or equal to $V_{noise}$.

As mentioned above, FET TN3 is provided to reduce the power consumption of sense amplifier circuit 200. FET TN3 is shown as an n-channel FET having its gate coupled to VCC, its source coupled to system ground VSS, and its drain coupled to bitline 210. FET TN3 is a weak pull-down device that eventually discharges bitline 210 to system ground VSS when the sense amplifier circuit 200 is operating in a reduced power mode and no data is being sensed. Each of the inverters INV1, INV2, INV3, and INV4 of sense amplifier circuit 200 may be a typical CMOS inverter, and during normal operation one or more of the inverters may operate in a region wherein both devices of the inverter are switched on simultaneously, providing a DC path between VCC and system ground VSS. Such DC paths result in power consumption. To eliminate DC paths due to the inverters and reduce power consumption of sense amplifier circuit 200 when no data is to be sensed, FET TN3 pulls bitline 210 to system ground VSS, causing each of the inverters to enter either a logic high state or a logic low state wherein only one device of each CMOS pair is switched on. FET TN3 is a weak pull-down device having a long channel length and a relatively high equivalent resistance such that the pull-down action of FET TN3 does not appreciably affect the bitline voltage $V_B$ during normal operation.

The operation of the sense amplifier circuit 200 will now be discussed with reference to specific examples. During a read cycle the precharge signal is high. If the selected memory location coupled to the bitline is erased, the bitline voltage $V_B$ remains constant or within the noise margin such that the discharge circuit 215 does not couple the bitline 210 to the sense node 220. The inverter INV3 senses a logic high and outputs a logic low such that the FET TP3 switches on, maintaining the voltage of the sense node 220 at VCC. The inverter INV4 inverts the output of inverter INV3 such that the sense amplifier circuit 200 outputs a logic high. In the subsequent precharge cycle, the precharge signal goes low such that FETs TP2 and TP4 are switched on.

If the selected memory location is programmed, the FET TN1 switches on, coupling the bitline 210 to the sense node 220. The sense node 220 and the bitline 210 are discharged towards ground. When the precharge signal at node 370 goes low and the select voltage to the selected wordline is removed, the sense node 220 and the bitline 210 begin to be charged towards VCC. FET TN1 remains on until bitline 210 is charged sufficiently to decrease $V_D$ such that the gate-source voltage of the FET TN1 is approximately $V_T$.

The bitline 210 is initially charged both by FET TP4 and FET TP2 via FET TN2 and FET TN1, respectively. When the FET TN1 is switched off, decoupling the sense node 220 from bitline 210, the bitline 210 continues to be charged towards VCC through FET TN2, which has its drain coupled to VCC via node 360 and FET TP4. The bitline 210 is charged until the voltage at node 350 is such that the gate-source voltage for FET TN2 drops to the threshold voltage for FET TN2, causing FET TN2 to decouple the bitline 210 from node 360. The continued charging of the bitline 210 causes the voltage $V_D$ at node 340 to be further decreased such that the gate-source voltage of the FET TN1 is less than $V_T$ by the noise margin voltage $V_{noise}$. Because the FET TP2 does not have to precharge the bitline 210 except for a short period of time, the FET TP2 can be a smaller device that sources less current and dissipates less power.

Figure 4:
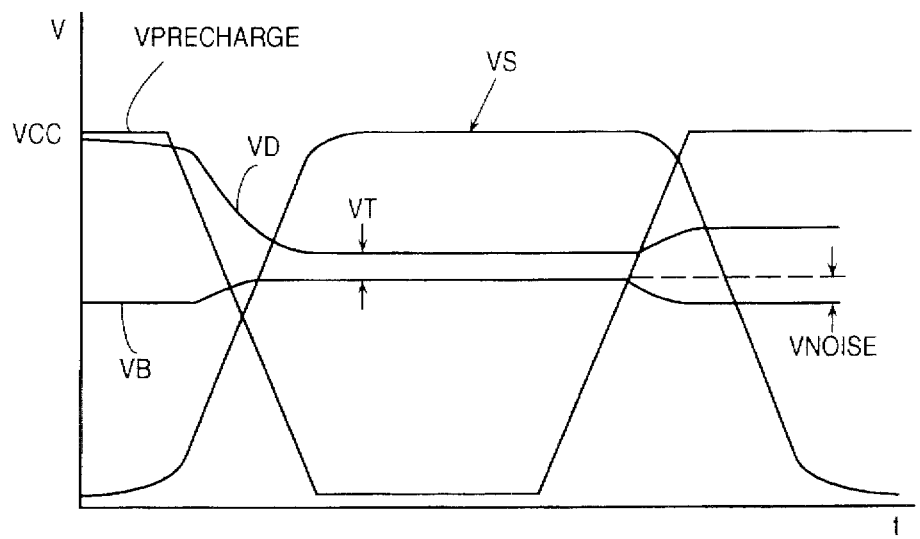
FIG. 4 is a timing diagram illustrating the operation of the first embodiment if no noise margin is provided.

Without the addition of the noise margin circuit that, in this embodiment, includes the FETs TN2 and TN4, and inverter INV2, the voltage $V_D$ at node 340 would remain at $V_T$ volts above the voltage level $V_B$ of bitline 210, as illustrated in FIG. 4. The danger, illustrated in FIG. 4, is that any noise on the bitline 210 that causes the voltage on bitline 210 to drop would cause the FET TN1 to switch on, even when the selected memory location is erased. This is because the voltage $V_D$ at node 340 is such that the gate-source voltage of FET TN1 is just at the threshold voltage $V_T$. Such a situation may result in invalid data being read from the addressed memory location.

Returning to FIG. 3, the inverter INV3 senses the state of the sense node 220. If the $V_S$ drops below a trip point voltage $V_{tp}$ for the inverter INV3, the INV3 outputs a logic high. If the $V_S$ remains above $V_{tp}$, the inverter INV3 outputs a logic low. This logic low level switches the FET TP3 on such that the sense node voltage $V_S$ remains at or near VCC. The inverter INV4 is coupled to receive the output of INV3, which INV4 inverts to provide the output voltage $V_{out}$. The thresholds of INV3 and INV4 are preferably skewed to favor the falling output transition at the sense node 220.

Figure 5:
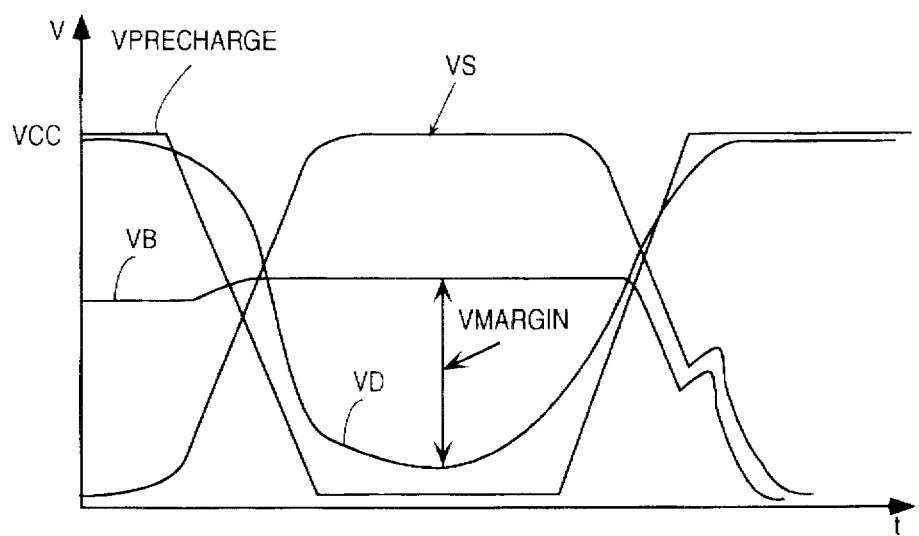
FIG. 5 is a timing diagram illustrating the operation of the first illustrative embodiment when a noise margin is provided.

FIG. 5 is a timing diagram illustrating the operation of the first illustrative embodiment. As can be seen, the bitline voltage $V_B$ is precharged to an intermediate voltage between VCC and ground while the sense node voltage $V_S$ is precharged to approximately VCC. Because the voltage swing between the precharged and discharged levels of $V_S$ is limited, power consumption is reduced and speed is increased. Further, because $V_S$ discharges quickly towards $V_B$, inverter INV3 (see FIG. 3) need not be a hyper-sensitive device. As a result, the inverter INV3 acts approximately as an ideal switch, and does not draw much current. The increased discharge speed thus allows for greater flexibility in choosing the inverter INV3. Speed can be increased by providing a more sensitive inverter INV3, which allows the input voltage on the wordline to be deasserted sooner, preventing the bitline and sense node from being discharged further towards ground. A more sensitive inverter INV3 will typically result in a trade-off between increased speed for increased power consumption.

Thus, a single-ended sense amplifier circuit having increased sense speed, decreased power consumption, and adjustable noise margins has been described. In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A sense amplifier circuit comprising:

an output circuit that senses and indicates a state of a first node;

a precharge circuit coupled to an input of the output circuit, the precharge circuit is capable of charging the input of the output circuit to a first voltage level;

a discharge circuit coupled to the first node and to the input of the output circuit, the discharge circuit is capable of discharging the input of the output circuit from the first voltage level to a voltage level of the first node by coupling the input of the output circuit to the first node when a discharge input voltage level, derived from said voltage level of the first node, exceeds a threshold voltage level; and a noise margin circuit coupled to the first node, the noise margin circuit charges the first node to a second voltage level when the input of the output circuit is electrically decoupled from the first node, the second voltage level being less than the first voltage level such that the discharge input voltage level is less than the threshold voltage level by a predetermined noise margin voltage.

2. The sense amplifier circuit of claim 1, wherein the discharge circuit comprises:

a first inverter coupled to the first node, the first inverter outputs the discharge input voltage level by inverting the voltage level of the first node;

a first field effect transistor (FET) having a first end coupled to the input of the output circuit, a second end coupled to the first node, and a gate coupled to receive the discharge input voltage, the first FET couples the input of the output circuit to the first node when the discharge input voltage level exceeds the threshold voltage level.

3. The sense amplifier circuit of claim 2, wherein the noise margin circuit comprises:

a second inverter coupled to the first node, the second inverter outputs the second voltage level by inverting the voltage level of the first node;

a second FET including a first end coupled to the first node, a second end coupled to the first voltage level, and a gate coupled to receive the second voltage level, the second FET charges the first node towards the first voltage level until the second voltage level drops to a threshold voltage level of the second FET.

4. The sense amplifier circuit of claim 3, wherein the output circuit comprises:

a third inverter coupled to the input of the output circuit, the third inverter including the input, the third inverter senses a state of the first node; and a fourth inverter coupled to the output of the third inverter and an output of the output circuit.

5. The sense amplifier circuit of claim 1, wherein the sense amplifier circuit further comprises:

a clamping circuit coupled to the first node, the clamping circuit discharges the first node to the second voltage level when the voltage level of said first node exceeds the second voltage level.

6. The sense amplifier circuit of claim 5, wherein the discharge circuit comprises:

an inverter coupled to the node, the first inverter outputs the discharge input voltage by inverting the voltage level of the first node;

a first field effect transistor (FET) including a first end coupled to the input of the output circuit, a second end coupled to the first node, and a gate coupled to receive the discharge input voltage;

and wherein the clamping circuit comprises:

a second FET including a first end coupled to system ground, a second end coupled to the first node, and a gate coupled to the gate of the first FET.

7. A computer system comprising:

a memory; and a processor coupled to the memory, the processor including a register file having a memory location and a sense amplifier circuit coupled to the memory location via a first node, the sense amplifier circuit including:

an output circuit that senses and indicates a state of the first node;

a precharge circuit coupled to an input of the output circuit, the precharge circuit is capable of charging the input of the output circuit to a first voltage level;

a discharge circuit coupled to the first node and to the input of the output circuit, the discharge circuit is capable of discharging the input of the output circuit from the first voltage level to a voltage level of the first node by coupling the input of the output circuit to the first node when a discharge input voltage level, derived from said voltage level of the first node, exceeds a threshold voltage level; and a noise margin circuit coupled to the first node, the noise margin circuit charges the first node to a second voltage level when the input of the output circuit is electrically decoupled from the first node, the second voltage level being less than the first voltage level such that the discharge input voltage level is less than the threshold voltage level by a predetermined noise margin voltage.

8. The computer system of claim 7, wherein the discharge circuit comprises:

a first inverter coupled to the first node, the first inverter outputs the discharge input voltage level by inverting the voltage level of the first node; and a first field effect transistor (FET) having a first end coupled to the input of the output circuit, a second end coupled to the first node, and a gate coupled to receive the discharge input voltage, the first FET couples the input of the output circuit to the first node when the discharge input voltage exceeds the threshold voltage level.

9. The computer system of claim 8, wherein the noise margin circuit comprises:

a second inverter coupled to the first node, the second inverter outputs the second voltage level by inverting the voltage level of the first node; and a second FET having a first end coupled to the first node, a second end coupled to the first voltage level, and a gate coupled to receive the second voltage level, the second FET charges the first node towards the first voltage level until the second voltage level drops to a threshold voltage level of the second FET.

10. The computer system of claim 9, wherein the output circuit comprises:

a third inverter coupled to the input of the output circuit, the third inverter including the input, the third inverter for sensing a state of the first node; and a fourth inverter coupled to the output of the third inverter and an output of the output circuit.

11. The computer system of claim 7, wherein the sense amplifier circuit further comprises:

a clamping circuit coupled to the first node, the clamping circuit discharges the first node to the second voltage level when the voltage level of said first node exceeds the second voltage level.

12. The computer system of claim 11, wherein the discharge circuit comprises:

a first inverter coupled to the first node, the first inverter outputs the discharge input voltage by inverting the voltage level of the first node;

a first field effect transistor (FET) including a first end coupled to the input of the output circuit, a second end coupled to the first node, and a gate coupled to receive the discharge input voltage;

and wherein the clamping circuit comprises:

a second FET including a first end coupled to system ground, a second end coupled to the first node, and a gate coupled to the gate of the first FET.

13. A method for sensing a state of a first node, the method comprising the steps of:

providing an element for precharging a sense node to a first voltage level, the sense node having a sense capacitance;

providing an element for precharging the first node to a second voltage level that is less than the first voltage level when the sense node is decoupled from the first node, the first node having a first capacitance that is greater than the sense capacitance;

providing an element for coupling the sense node to the first node such that the sense node discharges to the second voltage level if the first node has a voltage drop that is greater than a noise margin voltage.

14. The method of claim 13, wherein the method further includes the step of providing an element that charges the first node to a third voltage level when the sense node is coupled to the first node.

15. The method of claim 14, wherein the second voltage level exceeds the third voltage level by the noise margin voltage.

16. A single-ended sense amplifier circuit comprising:

a bitline having a bitline voltage level;

an inverter having an input coupled to the bitline;

an output circuit having an input coupled to a sense node;

a transistor, coupled to an output of the inverter and between the bitline and the sense node, that couples the bitline to the sense node when the bitline voltage level is less than a predetermined threshold voltage level and that decouples the bitline from the sense node when the bitline voltage level exceeds the predetermined threshold voltage level;

a precharge circuit coupled to the sense node that charges the sense node to a first voltage level when the sense node is decoupled from the bitline; and a noise margin circuit coupled to the bitline that charges the bitline voltage level, when the sense node is decoupled from the bitline, to a second voltage level that is less than the first voltage level and that exceeds the predetermine threshold voltage level by a noise margin.

17. The computer system of claim 9, wherein the noise margin voltage is determined by a period of time during which the second FET remains switched on after the first FET is switched off.

* * * * *